United States Patent [19]

Kokawa et al.

[11] Patent Number: 5,419,786
[45] Date of Patent: May 30, 1995

[54] SEMICONDUCTOR SUBSTRATE FOR BIPOLAR ELEMENT

[75] Inventors: Yoshiko Kokawa; Kenji Kusakabe, both of Hyogo, Japan

[73] Assignee: Mitsubishi Denki Kabushiki Kaisha, Toyko, Japan

[21] Appl. No.: 210,398

[22] Filed: Mar. 18, 1994

[30] Foreign Application Priority Data

Jul. 2, 1993 [JP] Japan .................. 5-164803

[51] Int. Cl.$^6$ .......................... H01L 21/306
[52] U.S. Cl. .................. 148/33.5; 437/11; 437/12; 437/13; 437/10
[58] Field of Search .......... 437/10, 11, 12, 13; 148/33.5

[56] References Cited

U.S. PATENT DOCUMENTS

| 4,053,335 | 10/1977 | Hu .................. 156/612 |
| 5,110,404 | 5/1992 | Fusegawa et al. .......... 437/10 |
| 5,327,007 | 7/1994 | Imura et al. .......... 437/10 |

FOREIGN PATENT DOCUMENTS

| 0496382 | 7/1992 | European Pat. Off. ........ 437/10 |
| 60-94722 | 5/1985 | Japan . |
| 0128531 | 6/1987 | Japan .................. 437/12 |
| 1-148800 | 6/1989 | Japan . |
| 2-180789 | 7/1990 | Japan . |
| 2-263792 | 10/1990 | Japan . |
| 3-235333 | 10/1991 | Japan . |
| 3-275586 | 12/1991 | Japan . |
| 4130732 | 5/1992 | Japan .................. 437/10 |
| 4163920 | 6/1992 | Japan .................. 437/12 |

OTHER PUBLICATIONS

Semiconductor Silicon Crystal Technology, Academic Press, pp.128–131, 1989, Fumio Shimura.
Semiconductor Silicon Crystal Technology, Academic Press, pp. 60–63 and 286–289, 1989, Fumio Shimura.

*Primary Examiner*—R. Bruce Breneman
*Assistant Examiner*—Ramamohan Rao Paladugu
*Attorney, Agent, or Firm*—Lowe, Price, LeBlanc & Becker

[57] ABSTRACT

A semiconductor substrate allowing reduction of crystal defects in a device formation region of an epitaxial silicon layer and allowing control of the amount of internal precipitation defects of the single crystal silicon substrate, a method of manufacturing such semiconductor substrate, and a semiconductor device utilizing such semiconductor substrate are disclosed. The semiconductor substrate includes a single crystal silicon substrate, an epitaxial silicon layer, and a polycrystalline silicon layer. The interstitial oxygen concentration of the single crystal silicon substrate is set within the range of $12.5–14.0 \times 10^{17}$ (atoms/cm3) according to the old ASTM specification. The epitaxial silicon layer is formed on the top surface of the single crystal silicon substrate. The polycrystalline silicon layer is formed at least on the rear surface of the single crystal silicon substrate to a thickness of at least 1 μm.

2 Claims, 4 Drawing Sheets

CUTTING POSITION FROM SHOULDER OF SILICON INGOT
(RATIO OF CUTTING POSITION TO
THE LENGTH OF SILICON INGOT)

SEMICONDUCTOR SUBSTRATE FOR BIPOLAR ELEMENT

BACKGROUND OF THE INVENTION

1. Field of the Invention

The present invention relates to a semiconductor substrate and a method of manufacturing the same, and a semiconductor device utilizing such semiconductor substrate. More particularly, it relates to a semiconductor substrate for bipolar IC and BiCMOS and a manufacturing method thereof, and a semiconductor device utilizing such semiconductor substrate.

2. Description of the Background Art

Figure 7:
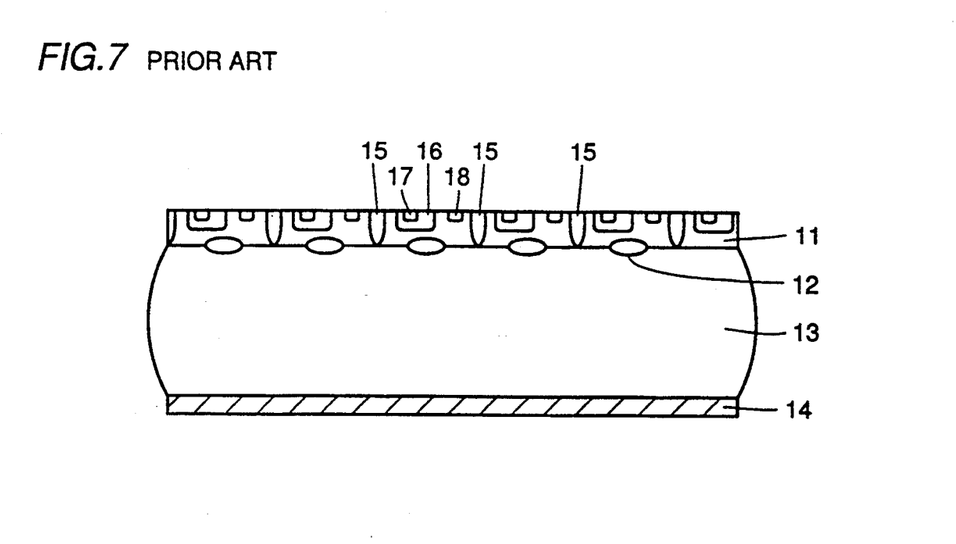
FIG. 7 is a cross sectional view showing a conventional buried diffusion epitaxial wafer.

FIG. 7 is a cross sectional view showing a buried diffusion epitaxial wafer formed by utilizing a conventional silicon substrate for bipolar IC and BiCMOS. Referring to FIG. 7, in the conventional buried diffusion epitaxial wafer, a buried diffusion layer 12 is formed on a top surface of a single crystal silicon substrate 13 at a predetermined interval. An epitaxial layer 11 of silicon is formed on the top surface of single crystal silicon substrate 13 and buried diffusion layer 12. A polycrystalline silicon layer 14 having a thickness of 1.0–2.5 μm is formed on a rear surface of single crystal silicon substrate 13.

Buried diffusion layer 12 is formed for decreasing collector resistance of bipolar IC or BiCMOS formed in epitaxial layer 11. Polycrystalline silicon layer 14 is formed for conducting gettering utilizing crystal defects included therein. Heavy metals such as Cu, Fe, and Au entered during manufacturing process are removed from electrically active regions of semiconductor elements by gettering.

A method of manufacturing a conventional buried diffusion epitaxial wafer shown in FIG. 7 will be described.

Figure 8:
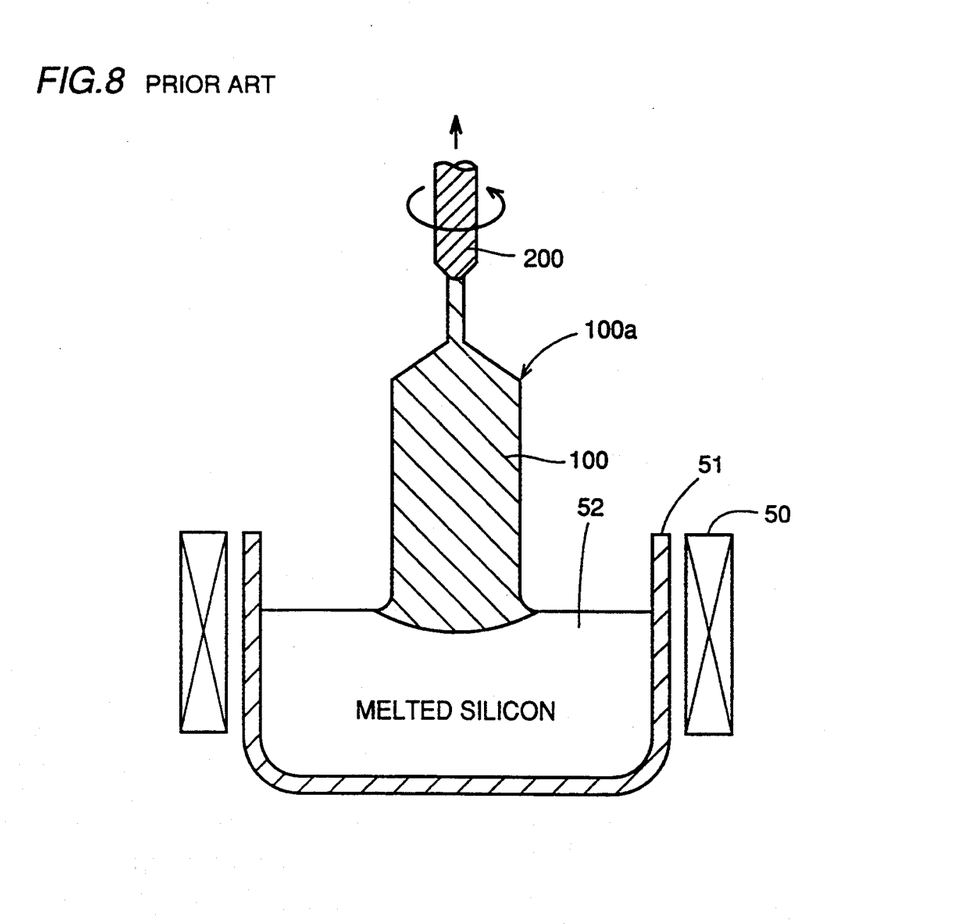
FIG. 8 is an illustration of a conventional manufacturing process of the silicon ingot by Czochralski method.

Single crystal silicon substrate 13 is grown by Czochralski method. Czochralski method is disclosed, for example, in *Semiconductor Silicon Crystal Technology* (1989), Academic Press, Inc., by Fumio Shimura, pp. 129–131. FIG. 8 is an illustration of manufacturing of a single crystal by Czochralski method. Referring to FIG. 8, polycrystalline silicon (not shown) is put in a quartz crucible 51 and heated by a heater 50 to be turned to melted silicon 52.

Then, the melted silicon 52 is brought into contact with a seed crystal 200 which is pulled up while being rotated. Accordingly, a single crystal silicon (silicon ingot) 100 having the same crystal axis as seed crystal 200 is grown. The pulling up speed of the conventional single crystal silicon 100 is about 1.0 mm/min. The interstitial oxygen concentration of single crystal silicon 100 has been controlled to 9–16×10$^{17}$ (atoms/cm$^3$) according to the old ASTM (old American Society for Testing and Materials).

Then, single crystal silicon 100 formed as described above is sliced thin so as to form single crystal silicon substrate 13 as shown in FIG. 7.

Thereafter, polycrystalline silicon layer 14 is formed on the rear surface of single crystal silicon substrate 13 by the CVD method at the temperature of 650° C. Buried diffusion layer 12 serving as a floating collector of the bipolar element is formed in a predetermined region on the top surface of single crystal silicon substrate 13 at a predetermined interval by, for example, the ion implantation method. Epitaxial layer 11 is grown on single crystal silicon substrate 13 and buried diffusion layer 12 at the temperature of about 1100° C.

Conventionally, the buried diffusion epitaxial wafer is formed as described above. Bipolar IC or BiCMOS is formed in epitaxial layer 11 of such buried diffusion epitaxial wafer. For example, as shown in FIG. 7, a bipolar transistor including a base layer 16, an emitter layer 17, and a collector layer 18 has been formed on the main surface of epitaxial layer 11. An isolation layer 15 has been provided in order to isolate such bipolar transistors.

Conventionally, as described above, the interstitial oxygen concentration of single crystal silicon substrate 13 is controlled to 9–16×10$^{17}$ (atoms/cm$^3$) according to the old ASTM specification.

However, in the conventional buried diffusion epitaxial wafer shown in FIG. 7, heat treatment is conducted at the temperature of 650° C. at the time of formation of polycrystal silicon layer 14, and in addition, heat treatment at the temperature of 1100° C. is conducted during the growth of epitaxial layer 11.

In this case, if interstitial oxygen concentration is as high as 15.0×10$^{17}$ (atoms/cm$^3$), generation of internal precipitation defects is accelerated because of heat hysteresis of the above-mentioned heat treatments. This results in crystal defects even in the element formation region of epitaxial layer 11 (a region up to a few μm from the surface of epitaxial layer 11).

When there is such a large amount of internal precipitation defects as to form crystal defects even in the element formation region, electrical characteristics of elements are deteriorated and warp of the buried diffusion epitaxial wafer is increased. Further, if crystal defects are precipitated even in the element formation region, crystal layers are slipped with each other. Such slipping is disclosed in, for example, *Semiconductor Silicon Crystal Technology* (1989), Academic Press, Inc., by Fumio Shimura, pp. 60–63, and pp. 286–289.

In the conventional buried diffusion epitaxial wafer shown in FIG. 7, gettering of heavy metal impurity is conducted by using crystal defects in polycrystalline silicon layer 14 and internal precipitation defects in single crystal silicon substrate 13. In this case, if single crystal silicon substrate 13 having a low interstitial oxygen concentration such as 10×10$^{17}$ (atoms/cm$^3$) is used, there is not provided enough internal precipitation defects to carry out gettering of the heavy metal impurity generated during formation of elements.

When gettering is not sufficient, the heavy metal impurity is precipitated up to the surface of epitaxial layer 11 so that OSF (Oxidation Induced Stacking Fault) is formed on the surface of epitaxial layer 11 with the heavy metal impurity serving as a carnal. Such OSF deteriorates electrical characteristics of elements.

Conventionally, various problems as described above have occurred, because the range of the interstitial oxygen concentration of single crystal silicon substrate 13 is set rather wide without considering heat treatment and gettering effect during formation of polycrystalline silicon layer 14 and epitaxial layer 11.

When forming single crystal silicon substrate 13 by Czochralski method, if the speed of cooling the single crystal silicon 100 which is pulled up is too fast, point defects generated during the growth of crystals are combined to form a large crystal defect.

If single crystal silicon substrate 13 shown in FIG. 7 is cut away from single crystal silicon 100 having such a large defect an inconvenience is generated. If there is a large defect in single crystal silicon substrate 13, many crystal defects are generated also on the surface of epitaxial layer 11 grown up on the top surface of single crystal silicon substrate 13. Thus, if elements are formed on the surface of epitaxial layer 11 including many crystal defects, the electrical characteristics of elements are deteriorated.

SUMMARY OF THE INVENTION

An object of the present invention is to reduce the precipitation amount of crystal defects generated in an element formation region of an epitaxial silicon layer formed on a top surface of a single crystal silicon substrate of a semiconductor substrate.

Another object of the present invention is not to deteriorate electrical characteristics of semiconductor elements formed on a main surface of the epitaxial layer of the single crystal silicon substrate in a semiconductor device.

Still another object of the present invention is to effectively prevent inclusion of large crystal defects in a silicon wafer cut away from a silicon ingot during manufacturing the semiconductor substrate.

According to one aspect of the present invention, a semiconductor substrate includes a single crystal silicon substrate having a top surface and a rear surface and an interstitial oxygen concentration within the range of $12.5-14.0 \times 10^{17}$ (atoms/cm$^3$) according to the old ASTM specification; an epitaxial silicon layer formed on the top surface of the single crystal silicon substrate; and a polycrystalline silicon layer formed at least on the rear surface of the single crystal silicon substrate.

In the semiconductor substrate, the interstitial oxygen concentration of the single crystal silicon substrate is set not to exceed $14.0 \times 10^{17}$ (atoms/cm$^3$) according to the old ASTM specification, the epitaxial silicon layer is formed on the top surface of the single crystal substrate, and the polycrystalline silicon layer is formed at least on the rear surface of the single crystal silicon substrate. Thus, even if heat treatment at the temperature of 650° C. is conducted during formation of the polycrystalline silicon layer and heat treatment at the temperature of 1100° C. is conducted during formation of the epitaxial silicon layer, precipitation of crystal defects up to the element formation region of the epitaxial silicon layer caused by acceleration of generation of internal precipitation defects in the single crystal silicon substrate can be prevented effectively. Also, since the interstitial oxygen concentration of the single crystal silicon substrate is set to at least $12.5 \times 10^{17}$ (atoms/cm$^3$) according to the old ASTM specification, a sufficient amount of internal precipitation defects required to carry out gettering in the single crystal silicon substrate can be formed.

According to another aspect of the present invention, a semiconductor device includes a single crystal silicon substrate having a top surface and a rear surface and an interstitial oxygen concentration within the range of $12.5-14.0 \times 10^{17}$ (atoms/cm$^3$) according to the old ASTM specification; an epitaxial silicon layer formed on the top surface of the single crystal silicon substrate; a semiconductor element formed on a main surface of the epitaxial silicon layer; and a polycrystalline silicon layer formed at least on the rear surface of the single crystal silicon substrate.

In the semiconductor device, the interstitial oxygen concentration of the single crystal silicon substrate is set not to exceed $14.0 \times 10^{17}$ (atoms/cm$^3$), the epitaxial silicon layer is formed on the top surface of the single crystal silicon substrate, and the polycrystalline silicon layer is formed at least on the rear surface of the single crystal silicon substrate. Thus, even if heat treatment at the temperature of about 650° C. is conducted at the formation of polycrystalline silicon layer and heat treatment at the temperature of about 1100° C. is conducted at the formation of the epitaxial silicon layer, precipitation of crystal defects up to the element formation region of the epitaxial silicon layer caused by acceleration of generation of the internal precipitation defects in the single crystal silicon substrate can be prevented effectively. Consequently, the electrical characteristics of semiconductor elements formed on the main surface of the epitaxial silicon layer can be maintained, free from deterioration.

According to one aspect of the present invention, a method of manufacturing a semiconductor substrate includes the steps of forming, by Czochralski method, a silicon ingot having the interstitial oxygen concentration within the range of $12.5-14.0 \times 10^{17}$ (atoms/cm$^3$) according to the old ASTM specification; cutting away a silicon wafer having a top surface and a rear surface from a region where a predetermined density of crystal defects can be obtained starting from a shoulder of the pulling up side of the silicon ingot; and forming a polycrystalline silicon layer at least on the rear surface of the silicon wafer.

In the manufacturing method of the semiconductor substrate, the silicon ingot having the interstitial oxygen concentration within the range of $12.5-14.0 \times 10^{17}$ (atoms/cm$^3$) according to the old ASTM specification is formed by Czochralski method, and the silicon wafer is cut away from the region where the predetermined density of crystal defects can be obtained starting from the shoulder of the pulling up side of the silicon ingot. Since a large crystal defect formed by a combination of point defects is hardly formed in the shoulder portion of the silicon ingot where the cooling speed is slower than the tail portion, the silicon wafer cut away from the vicinity of such shoulder portion does not include a large number of such large crystal defects.

According to another aspect of the present invention, the manufacturing method of the semiconductor substrate includes the steps of forming, by Czochralski method, the silicon ingot having the interstitial oxygen concentration within the range of $12.5-14.0 \times 10^{17}$ (atoms/cm$^3$) according to the old ASTM specification at such crystal pulling up speed as to obtain a predetermined density of crystal defects in the tail portion of the silicon ingot; cutting away a silicon wafer having a top surface and a rear surface; and forming the polycrystalline silicon layer at least on the rear surface of the silicon wafer.

In the manufacturing method of the semiconductor substrate, the cooling speed during formation of the silicon ingot slows down because the silicon ingot having the interstitial oxygen concentration of $12.5-14.0 \times 10^{17}$ (atoms/cm$^3$) according to the ASTM specification is formed at such crystal pulling up speed as to obtain the predetermined density of crystal defects in the tail portion thereof. This effectively prevents point defects generated during the growth of crystal from being combined to form a large crystal defect.

According to still another aspect of the present invention, the manufacturing method of the semiconductor substrate includes the steps of, by Czochralski method, forming the silicon ingot having the interstitial oxygen concentration within the range of 12.5–14.0×10$^{17}$ (atoms/cm$^3$) according to the old ASTM specification; heating the silicon ingot at a high temperature not more than the melting point of silicon and then cooling the same slowly; cutting away the silicon wafer having a top surface and a rear surface from the silicon ingot; and forming the polycrystalline silicon layer at least on the rear surface of the silicon wafer.

In the manufacturing method of the semiconductor substrate, after the silicon ingot is formed by Czochralski method, the silicon ingot is heated again at a high temperature not more than the melting point of silicon and then the silicon ingot is cooled slowly. Accordingly, the large crystal defect grown from point defects during formation of the silicon ingot can be repaired by this heating and slow cooling.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described referring to the drawings.

Figure 1:
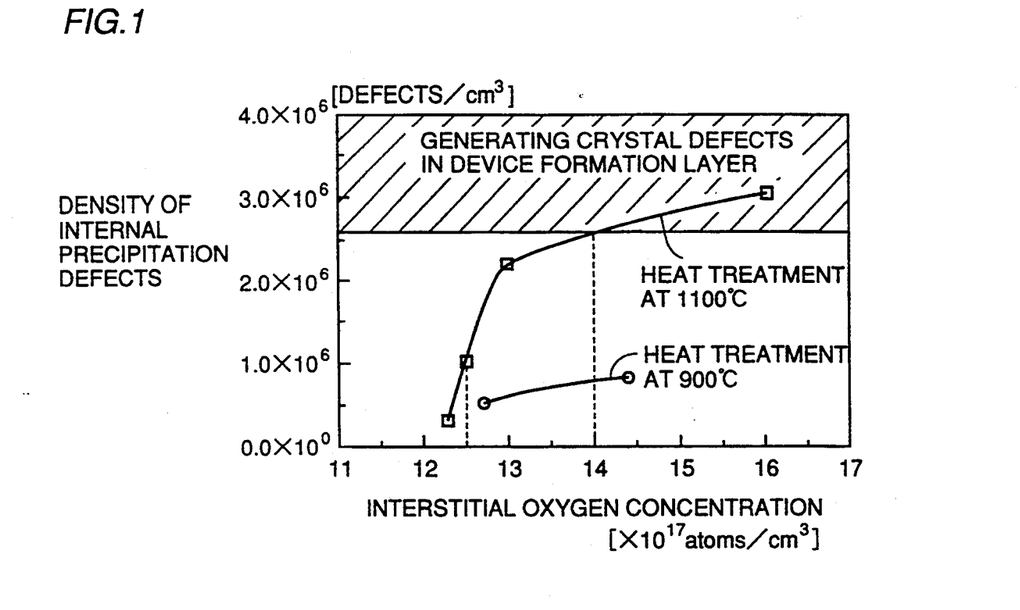
FIG. 1 is a graph showing the relationship between interstitial oxygen concentration and internal precipitation defects of the single crystal silicon substrate when heat treatments are conducted at 900° C. and at 1100° C. on the single crystal silicon substrate having a polycrystalline silicon layer formed on the rear surface to the thickness of 1.5 μm.

The density of internal precipitation defects shown in FIG. 1 indicates the number of internal precipitation defects per unit volume measured by infrared tomography. It is noted from FIG. 1 that by heat treatment at the temperature of about 900° C., the density of internal precipitation defects does not much increase even if the interstitial oxygen concentration is high. In other words, generation of internal precipitation defects is not so much accelerated by the heat treatment of about 900° C. even if the interstitial oxygen concentration is high.

On the contrary, by the heat treatment of 1100° C., the density of internal precipitation defects increases prominently as the interstitial oxygen concentration increases. In other words, in the heat treatment of 1100° C., generation of internal precipitation defects is accelerated according to the interstitial oxygen concentration. Consequently, crystal defects are precipitated up to the device formation layer on the surface of the semiconductor substrate. If crystal defects are precipitated in the device formation layer, the electrical characteristics of the device will deteriorate. In addition, if the precipitation amount of crystal defects on the surface of the semiconductor substrate increases, the semiconductor substrate warps or crystal layers slip with each other.

Conventionally, bipolar IC or BiCMOS is formed at the surface region of the epitaxial layer grown on the surface of the silicon substrate. Heat treatment is conducted at the temperature of about 1100° C. when the epitaxial layer is grown. If the interstitial oxygen concentration is high, the density of internal precipitation defects increases so much (see FIG. 1). Accordingly, crystal defects are precipitated up to the surface region of the epitaxial layer where bipolar IC or the like is formed.

In light of the above, the present invention controls the interstitial oxygen concentration of the silicon substrate used for the device which is subjected to the heat treatment of about 1100° C.

Figure 2:
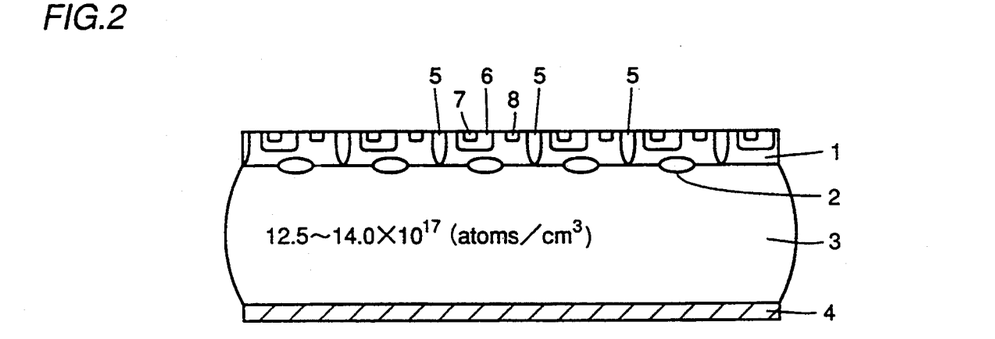
FIG. 2 is a cross sectional view showing a buried diffusion epitaxial wafer according to one embodiment of the present invention.

Referring to FIG. 2, in the buried diffusion epitaxial wafer of the present embodiment, the interstitial oxygen concentration of a single crystal silicon substrate 3 is set within the range of 12.5–14.0×10$^{17}$ (atoms/cm$^3$) according to the old ASTM specification. A buried diffusion layer 2 is formed in a predetermined region on a top surface of single crystal silicon substrate 3 for decreasing collector resistance of a bipolar element. An epitaxial layer 1 for forming bipolar IC or the like is provided on single crystal silicon substrate 3 and buried diffusion layer 2.

A polycrystalline silicon layer 4 is formed on a rear surface of single crystal silicon substrate 3 with a thickness of 1.0 μm–2.5 μm. Effect of capturing heavy metal impurity (gettering effect) can be obtained by utilizing crystal defects included in the polycrystalline silicon layer 4.

In the present embodiment, the interstitial oxygen concentration of single crystal silicon substrate 3 is set to 12.5–14.0×10$^{17}$ (atoms/cm$^3$) according to the old ASTM specification because of the reason below.

When forming epitaxial layer 1, if the interstitial oxygen concentration is set to be more than 14.0×10$^{17}$ (atoms/cm$^3$) and the heat treatment of 1100° C. is conducted, the density of internal precipitation defects increases too much as shown in FIG. 1, causing precipitation of crystal defects up to the device formation region of epitaxial layer 1. Accordingly, the electrical characteristics of elements such as bipolar IC formed on the surface region of epitaxial layer 1 deteriorate. Thus, in the structure including epitaxial layer 1, the interstitial oxygen concentration of single crystal silicon substrate 3 should be set not to exceed 14.0×10$^{17}$ (atoms/cm$^3$).

On the contrary, if there are few internal precipitation defects in single crystal silicon substrate 3, gettering cannot be carried out sufficiently. In other words, in the structure shown in FIG. 2, gettering of the heavy metal impurity is carried out by using crystal defects included in polycrystalline silicon layer 4 and internal precipitation defects included in single crystal silicon substrate 3.

Since the heavy metal impurity is introduced mainly from the top surface of single crystal silicon substrate 3, gettering of the heavy metal impurity cannot be conducted sufficiently only by polycrystalline silicon layer 4 formed on the rear surface of single crystal silicon substrate 3. The density of internal precipitation defects of single crystal silicon substrate 3 should be at least about $1.0 \times 10^6/cm^3$. Referring to FIG. 1, in order to achieve the density of internal precipitation defects of at least $1.0 \times 10^6/cm^3$ in the case of conducting the heat treatment of 1100° C., the intersticial oxygen concentration needs to be at least $12.5 \times 10^{17}$ (atoms/cm$^3$).

Even if the thickness of polycrystalline silicon layer 4 changes to some extent, it does not much affect the relationship between the interstitial oxygen concentration and the density of internal precipitation defects shown in FIG. 1. More particularly, the deposition temperature of polycrystalline silicon layer is about 650° C., and the more the thickness of polycrystalline silicon layer 4 increases, the longer it is subjected to the temperature of 650° C. However, generation of the internal precipitation defects of single crystal silicon substrate 3 is not promoted at the temperature of as low as about 650° C. For example, if the thickness of polycrystalline silicon layer 4 changes within the range of 0.8-2.5 μm, the relation between the interstitial oxygen concentration and density of internal precipitation defects shown in FIG. 1 is not much affected. In other words, when the thickness of polycrystalline silicon layer 4 changes within the range of 0.8-2.5 μm, if the interstitial oxygen concentration is set to $12.5 \times 10^{17}$ (atoms/cm$^3$), the density of internal precipitation defects is kept at about $1.0 \times 10^6/cm^3$.

Therefore, in the present embodiment, the interstitial oxygen concentration of single crystal silicon substrate 3 is set within the range of $12.5-14.0 \times 10^{17}$ (atoms/cm$^3$).

The process of manufacturing the buried diffusion epitaxial wafer shown in FIG. 2 will be described briefly.

(1) A silicon ingot (not shown) for forming single crystal silicon substrate 3 is formed by Czochralski method so as to have the interstitial oxygen concentration of $12.5-14.0 \times 10^7$ (atoms/cm$^3$) according to the old ASTM specification. The interstitial oxygen concentration can be controlled easily by adjusting conditions of pulling up the silicon ingot.

(2) Single crystal silicon substrate 3 is formed by slicing the silicon ingot. A polycrystalline silicon layer 4 is formed by the CVD method on the rear surface of single crystal silicon substrate 3 to a thickness of about 1.0-2.5 μm at the temperature of 650° C.

(3) A buried diffusion layer 2 is formed in a predetermined region on the top surface of single crystal silicon substrate 3 at a predetermined interval by, for example, the ion implantation method. An epitaxial layer 1 is grown on the top surface of buried diffusion region 2 and single crystal silicon substrate 3 at the temperature of about 1100° C. The buried diffusion epitaxial wafer is thus formed, and then bipolar IC or BiCMOS is formed at the surface of epitaxial layer 1. For example, as shown in FIG. 2, a bipolar transistor including a base layer 6, an emitter layer 7, and a collector layer 8 is formed at the surface of epitaxial layer 1. After that, an isolation layer 5 is formed for isolating adjacent bipolar transistors.

In the present embodiment, the amount of crystal defects generated in the device formation region of epitaxial layer 1 can be reduced by setting the interstitial oxygen concentration of single crystal silicon substrate 3 within the range of $12.5-14.0 \times 10^{17}$ (atoms/cm$^3$) according to the old ASTM specification. This can prevent deterioration of the electrical characteristics of the bipolar IC or the like effectively when such bipolar IC or the like is formed in the device formation region of epitaxial layer 1.

The present invention provides the following improvements in the manufacturing process for forming single crystal silicon substrate 3 in order to enhance the above-mentioned effect.

Figure 3:
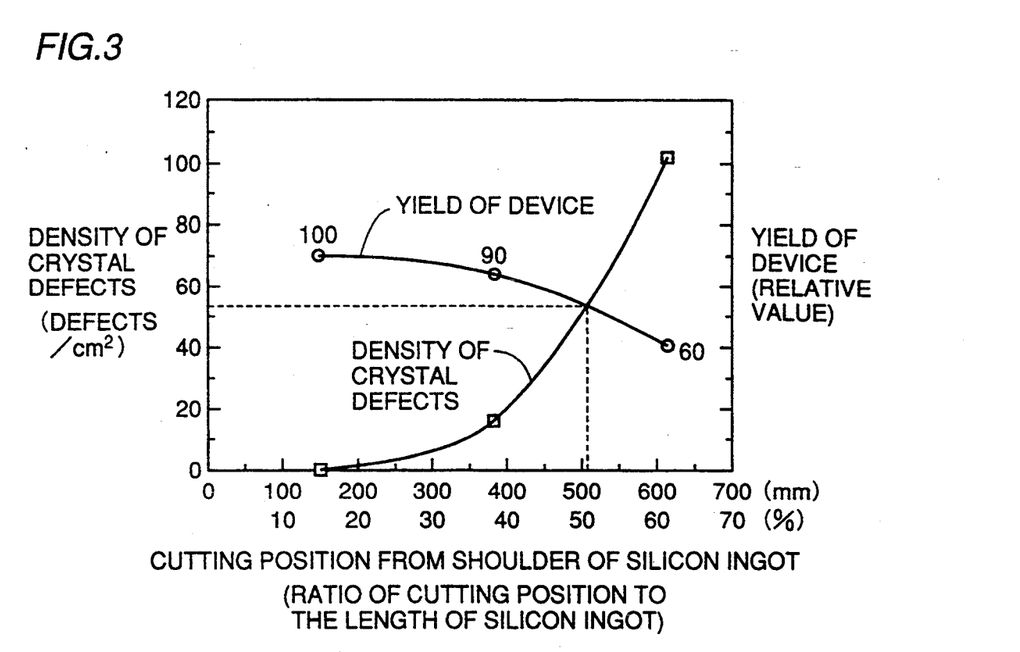
FIG. 3 is a graph showing the relationship between cutting positions of the silicon ingot relative to the shoulder thereof with the density of crystal defects on the surface of the epitaxial layer, or with the yield of device.
Figure 4:
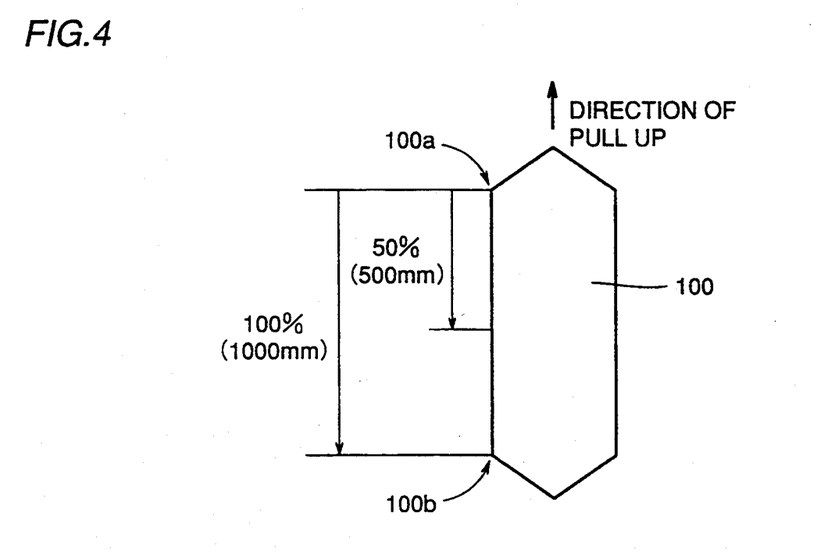
FIG. 4 schematically shows the length of the silicon ingot from the shoulder thereof.

Referring to FIGS. 3 and 4, the first embodiment of the manufacturing process of the single crystal silicon substrate will be described. In FIG. 3, a curve of the density of crystal defects corresponds to the case when the silicon ingot pulled up at the crystal pulling up speed of 0.8 mm/min. is used. There can be provided an approximately the same curve of the density of the crystal defects as shown in FIG. 3 as long as the crystal pulling up speed is within the range of 0.8-1.2 mm/min.

As shown in FIG. 3, the density of the crystal defects generated on the surface of epitaxial layer 1 (see FIG. 2) increases as the cutting position is further apart from the shoulder of the silicon ingot. This is because the cooling speed of the crystal during pulling up is slower at a shoulder portion 100a of silicon ingot 100 compared to a tail portion 100b and cooling proceeds slowly.

In other words, silicon ingot 100 is cooled naturally when being pulled up (see FIG. 8). In this case, tail portion 100b is still in contact with a melted silicon 52 of a high temperature when shoulder portion 100a is cooled naturally. Thus, shoulder portion 100a is cooled naturally while being subjected to heat from tail portion 100b side. Accordingly, cooling speed of shoulder portion 100a is relatively slow.

On the contrary, tail portion 100b is cooled after silicon ingot 100 is completely pulled up. More particularly, tail portion 100b is cooled without being in contact with melted silicon 52 having a high temperature. The cooling speed of tail portion 100b side is relatively fast. Thus, the cooling speed of the crystal is slower at shoulder portion 100a compared to tail portion 100b. This effectively prevents point defects taken in during the growth of the crystal from being combined to form a large crystal defect at shoulder portion 100a.

Consequently, there are few large crystal defects in single crystal silicon substrate 3 cut away from the side of shoulder portion 100a. If the device is finally formed using such single crystal silicon substrate 3, few crystal defects are generated on the surface of epitaxial layer 1.

In single crystal silicon substrate 3 cut away from tail portion 100b, however, many large crystal defects are included. If the device is finally formed using such single crystal silicon substrate 3, a large number of crystal defects are generated on the surface of epitaxial layer 1. Therefore, as shown in FIG. 3, the density of the crystal defects on the surface of epitaxial layer 1 increases as the cutting position thereof is further apart from the shoulder of the silicon ingot.

In addition as shown in FIG. 3, the yield of device decreases as the density of the crystal defects increases. In other words, if the density of the crystal defects on the surface of epitaxial layer 1 becomes higher, the characteristic of the device formed on the surface of epitaxial layer 1 deteriorates, causing decrease of the yield of device.

In the first embodiment of the manufacturing process for forming such single crystal silicon substrate, the position where single crystal silicon substrate 3 (see FIG. 2) is cut away from the silicon ingot is limited, taking into consideration the density of the crystal defects and the yield of device shown in FIG. 3. In the first embodiment, as shown in FIG. 4, single crystal silicon substrate 3 is cut away from the region up to 500 mm from shoulder 100a of silicon ingot 100. Thus, the decrease of the yield of device can be prevented effectively.

Figure 5:
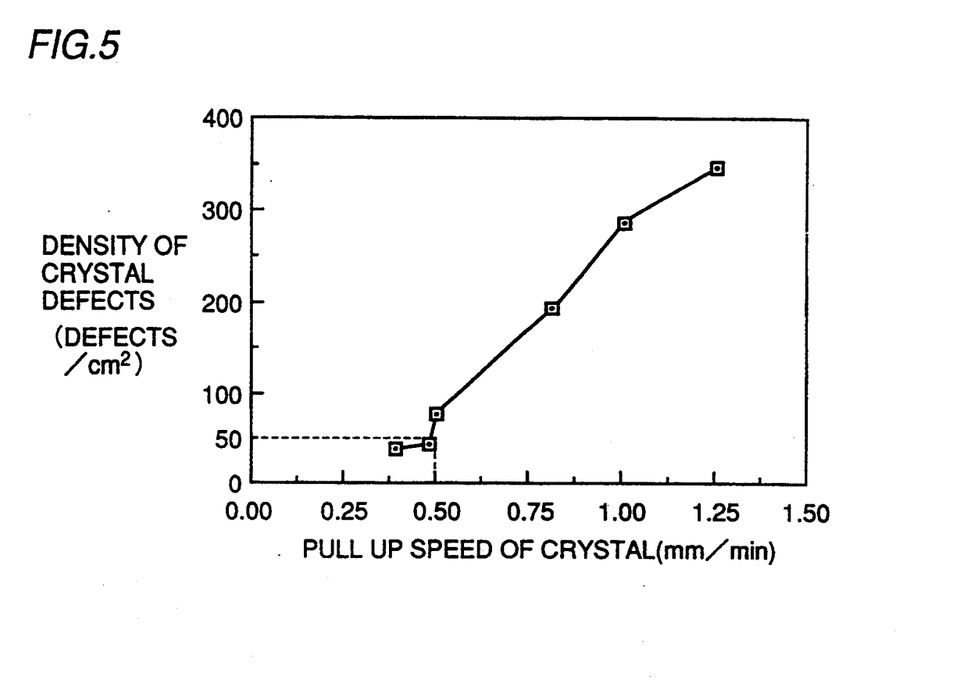
FIG. 5 is a graph showing the relationship between the crystal pulling up speed and the density of crystal defects on the surface of the epitaxial layer.

FIG. 5 is a graph showing data of the case when the single crystal silicon substrate is cut away from the vicinity of the tail portion having higher density of the crystal defects. The density of the crystal defects shown in FIG. 5 represents the density per unit area. Referring to FIG. 5, the second embodiment of the manufacturing process for forming single crystal silicon substrate 3 shown in FIG. 2 will be described. As shown in FIG. 5, the density of the crystal defects generated on the surface of epitaxial layer 1 (see FIG. 2) increases according to the crystal pulling up speed of the silicon ingot. This is because the cooling speed of the silicon ingot increases in proportion to the pulling up speed of the silicon ingot by Czochralski method, which is likely to cause point defects generated during the growth of the crystal to be combined to form a large crystal defect.

When the buried diffusion epitaxial wafer is formed using single crystal silicon substrate 3 cut away from the silicon ingot having such large crystal defects, the density of the crystal defects generated on the surface of epitaxial layer 1 increases. Thus, as the pulling up speed of the crystal becomes faster, the density of the crystal defects generated on the surface of epitaxial layer 1 increases.

In the second embodiment, the pulling up speed of the crystal is controlled so that the density of the crystal defects generated on the surface of epitaxial layer 1 does not exceed $50/cm^3$ In other words, the pulling up speed of the crystal during pulling up the silicon ingot by Czochralski method is set to be not faster than 0.5 mm/min.

Accordingly, the density of the crystal defects on the surface of epitaxial layer 1 formed on the silicon ingot as above can be controlled not exceed $50/cm^3$. Consequently, deterioration of the characteristic of the bipolar element formed on the surface of epitaxial layer 1 can be prevented effectively, and at the same time the yield of device can be improved.

Unlike the first embodiment described by referring to FIGS. 3 and 4, approximately the entire regions of the silicon ingot can be used in the second embodiment. More particularly, the data shown in FIG. 5 are measured by using the single crystal semiconductor substrate cut away from the tail portion of the silicon ingot having many crystal defects as described above. If the density of the crystal defects in the epitaxial layer on such single crystal semiconductor substrate is not more than $50/cm^3$, the density of the crystal defects in the epitaxial layer on the single crystal semiconductor substrate cut away from the shoulder portion side including less crystal defects must be at most $50/cm^3$. Unlike the first embodiment in which only about ½ of the silicon ingot can be utilized, single crystal silicon substrate 3 can be cut away from almost any portion of the silicon ingot in the second embodiment and thus the productivity of single crystal silicon substrate 3 can be improved.

The third embodiment of the manufacturing process for forming single crystal silicon substrate 3 shown in FIG. 2 will be described. In the third embodiment, after forming the silicon ingot having the interstitial oxygen concentration of $12.5-14.0 \times 10^{17}$ (atoms/cm$^3$) according to the old ASTM specification, the silicon ingot is again subjected to a high temperature not more than the melting point of silicon (1200° C.–1450° C.) for about 90 minutes in the shape of the ingot, and then it is cooled slowly.

Through such heating and slow cooling, large crystal defects formed during the growth of the silicon ingot can be repaired. Therefore, when cutting away single crystal silicon substrate 3 (see FIG. 2) from such silicon ingot and forming epitaxial layer 1 on single crystal silicon substrate 3, the number of crystal defects generated on the surface of epitaxial layer 1 (the device formation region) can be reduced.

Figure 6:
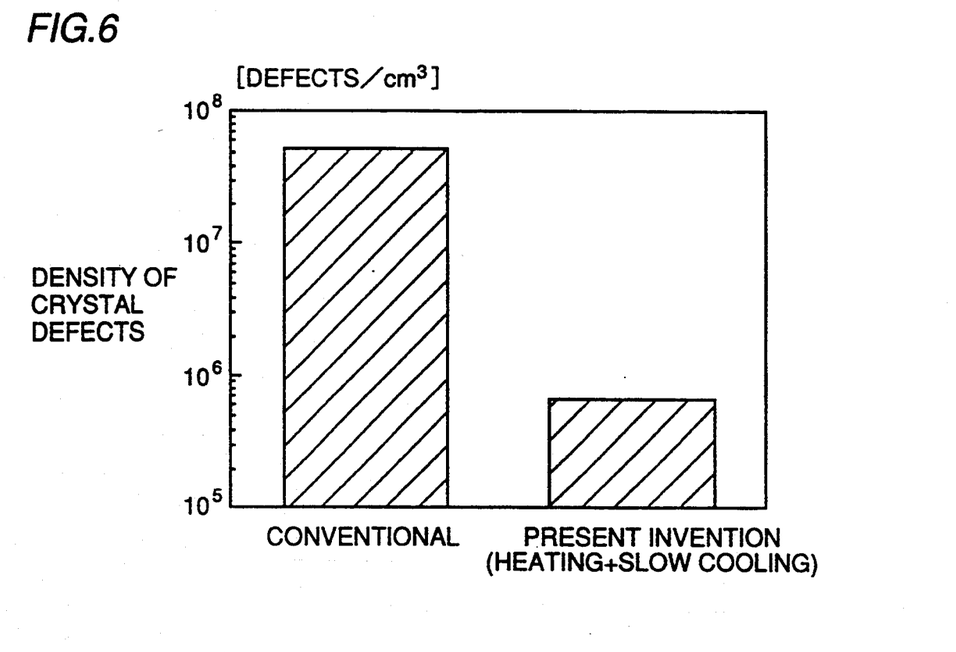
FIG. 6 is a graph showing the density of crystal defects precipitated in the device formation region of the epitaxial layer with or without heating and slow cooling of the silicon ingot.

FIG. 6 shows the density of the crystal defects indicating the number of crystal defects per unit volume measured by the infrared tomography. It is noted, referring to FIG. 6, that the density of the crystal defects generated in single crystal silicon substrate 3 (see FIG. 2) can be dramatically reduced when heating and slow cooling are carried out during formation of the silicon ingot as compared to the case when conducting such heating and slow cooling are not effected.

In addition, in the third embodiment, the time taken for manufacturing the silicon ingot can be reduced as compared to the above-described second embodiment. More particularly, in the second embodiment above, for example, it takes at least about 33 hours in order to grow up the silicon ingot having the length of 1000 mm, since the pulling up speed of the crystal is set slower than 0.5 mm/min.

On the other hand, in the third embodiment, heating and slow cooling are carried out after growing up the silicon ingot at the normal pulling up speed of crystal (about 1.0 mm/min.). In this case, for example, it takes about 16 hours to grow up the silicon ingot having the length of 1000 mm, and about five hours for heating and slow cooling. Thus, in the third embodiment, the time taken for manufacturing the silicon ingot can be reduced as compared to the second embodiment.

According to the semiconductor substrate of the present invention, the interstitial oxygen concentration of the single crystal silicon substrate is set not to exceed $14.0 \times 10^{17}$ (atoms/cm$^3$) according to the old ASTM specification and the epitaxial silicon layer is formed on the top surface of such single crystal silicon substrate. Thus, even if the heat treatment of about 1100° C. is conducted during formation of the epitaxial silicon layer, generation of crystal defects up to the surface of the epitaxial silicon layer, caused by acceleration of the generation of the internal precipitation defects of the single crystal silicon substrate, can be prevented effectively. At the same time, a certain amount of internal precipitation defects required for gettering can be formed within the single crystal silicon substrate by setting the interstitial oxygen concentration thereof to at least $12.5 \times 10^{17}$ (atoms/cm$^3$) according to the old ASTM specification. Accordingly, gettering of the heavy metal impurity can be carried out by the internal precipitation defects generated in the single crystal silicon substrate and the crystal defects of the polycrystalline silicon layer formed at least on the rear surface of the single crystal silicon substrate.

According to the semiconductor device of the present invention, the interstitial oxygen concentration of the single crystal silicon substrate is set not to exceed $14.0 \times 10^{17}$ (atoms/cm$^3$) according to the old ASTM specification, the epitaxial silicon layer is formed on the top surface of the single crystal silicon substrate, and the semiconductor element is formed on the main surface of the epitaxial silicon layer. Thus, even if heat treatment of about 1100° C. is conducted during formation of the epitaxial silicon layer, generation of the crystal defects up to the surface of the epitaxial silicon layer, caused by acceleration of generation of the internal precipitation defects in the single crystal substrate, can be prevented effectively. At the same time, a certain amount of internal precipitation defects required for gettering can be formed in the single crystal silicon substrate by setting the interstitial oxygen concentration of the single crystal silicon substrate to at least $12.5 \times 10^{17}$ (atoms/cm$^3$) according to the old ASTM specification. Thus, gettering of the heavy metal impurity can be carried out by the internal precipitation defects generated in the single crystal substrate and the crystal defects of the polycrystalline silicon layer formed on the rear surface of single crystal substrate.

According to one manufacturing method of the semiconductor substrate of the present invention, inclusion of large crystal defects in the silicon wafer can be prevented effectively by cutting away the silicon wafer from regions where a predetermined density of crystal defects can be obtained starting from the shoulder of the silicon ingot having the interstitial oxygen concentration of $12.5-14.0 \times 10^{17}$ (atoms/cm$^3$).

According to another manufacturing method of the semiconductor substrate of the present invention, point defects generated during the growth of the crystal can be prevented effectively from being combined to form of a large crystal defect by way of controlling the pulling up speed of the crystal during formation of the silicon ingot so that the density of the crystal defects does not exceed the predetermined density in the tail portion of the silicon ingot. This enables easy formation of the silicon ingot not including large crystal defects. Accordingly, when the semiconductor element is formed utilizing the silicon wafer cut away from such silicon ingot, the electrical characteristic of the semiconductor element can be improved.

According to still another manufacturing method of the semiconductor substrate of the present invention, after forming the silicon ingot having the interstitial oxygen concentration within the range of $12.5-14.0 \times 10^{17}$ (atoms/cm$^3$) according to the old ASTM specification by Czochralski method, the silicon ingot is subjected to the high temperature not more than the melting point of silicon and then is cooled slowly. Thus, large crystal defects generated during the growth of the silicon ingot by Czochralski method can be repaired effectively. By cutting away the silicon wafer from the silicon ingot in which large crystal defects have been repaired and by forming the semiconductor element utilizing the silicon wafer, a good characteristic of the semiconductor element can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor substrate, comprising:
    a single crystal silicon substrate including a top surface and a rear surface and having interstitial oxygen concentration within a range of $12.5-14.0 \times 10^{17}$ (atoms/cm$^3$) according to old ASTM specification;
    an epitaxial silicon layer formed on the top surface of said single crystal silicon substrate; and
    a polycrystalline silicon layer formed at least on the rear surface of said single crystal silicon substrate.

2. The semiconductor substrate according to claim 1, wherein
    a buried impurity layer is formed at an interval on the border between the top surface of said single crystal silicon substrate and said epitaxial silicon layer.

* * * * *